United States Patent [19]

Rawlinson et al.

[11] Patent Number: 4,792,793

[45] Date of Patent: Dec. 20, 1988

[54] CONVERTING NUMBERS BETWEEN BINARY AND ANOTHER BASE

[75] Inventors: Stephen J. Rawlinson, Sunnyvale; Jongwen Chiou, San Jose, both of Calif.

[73] Assignee: Amdahl Corporation, Sunnyvale, Calif.

[21] Appl. No.: 55,184

[22] Filed: May 28, 1987

[51] Int. Cl.$^4$ .............................................. H03M 7/00
[52] U.S. Cl. ........................................ 341/89; 341/104; 341/105
[58] Field of Search ................ 340/347 DD; 235/311

[56] References Cited

U.S. PATENT DOCUMENTS 3,803,392  4/1974  Amdhal et al. ................ 235/155
3,845,290  10/1974  Reitsmå ................... 340/347 DD X
4,342,026  7/1982  Hanson .................... 340/347 DD Primary Examiner—William M. Shoop, Jr.
Assistant Examiner—Richard K. Blum
Attorney, Agent, or Firm—Fliesler, Dubb, Meyer & Lovejoy

[57] ABSTRACT

Dedicated convert hardware is disclosed for performing bidirectional conversions of numbers between binary and another base b (illustratively decimal) for use in a data processing system. The dedicated convert hardware comprises a special purpose multiply-and-add unit and a convert register. The output of the multiply-and-add unit is coupled to the input of the convert register, and the output of the convert register is recycled to the inputs of the multiply-and-add unit. The multiply-and-add unit is hardwired to multiply the input by b and concurrently add the value at a separate digit input. Means are also provided for initializing the convert register with zero or with any desired number. The convert hardware is operated to convert a number from radix-b to binary by first initializing the convert register to zero and then iteratively clocking the multiply-and-add unit output into the convert register while presenting to the digit input of the multiply-and-add unit successively high- to low-order digits of the radix-b number. The convert hardware is operated to convert a binary number to radix-b by first initializing the convert register with the fractional part of a product $N*b^{-m}$, where N is the binary number and m is an integer greater than zero, and then repetitively clocking the output of the multiply-and-add unit into the convert register while the digit input of the multiply-and-add unit is held at zero. The integer part of each successive multiplication constitutes the successive radix-b digits.

13 Claims, 4 Drawing Sheets

FIG.—3

CONVERTING NUMBERS BETWEEN BINARY AND ANOTHER BASE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The invention relates to apparatus for converting numbers bidirectionally between binary and another base, such as binary-coded decimal.

2. Description of Related Art

A number coded according to an arbitrary radix b may be stored in a data processing system as a sequence of nibbles (distinct groups of bits), each nibble containing one radix-b digit. In the common example of BCD, each nibble is four bits wide and contains a decimal digit ranging in value between zero and nine.

It is often necessary to convert numbers between binary and radix b, and numerous algorithms using standard hardware have been developed to accomplish this. A typical algorithm for converting a radix-b number to binary operates by first initializing a binary accumulator to zero and then going into a loop in which the leading digit is peeled off the radix-b number and added into the binary accumulator while the previous contents of the accumulator are concurrently multiplied by b. One problem with using this algorithm is that multiplication is usually a two-step process, requiring two cycles to complete. The sum and carrying bits from a carry/save adder (CSA) are generated on the first cycle, and they are added together (and with the leading radix-b digit) on the second cycle. The approach therefore requires two clock cycles for each radix-b digit to complete.

The conversion may be improved to perform in one clock cycle per radix-b digit if two multiply-and-add algorithms are interleaved in the same multiplier. For example, a first accumulation may be made by multiplying the first digit by $b^2$ and adding the third digit, then multiplying the result by $b^2$ and adding the fifth digit, etc. The second accumulation may be obtained by multiplying the second digit by $b^2$ and adding the fourth digit, multiplying the result by $b^2$ and adding the sixth digit, etc. While one accumulation is in the multiply stage, the other accumulation is in the adding stage. After both accumulations are complete, the appropriate one is multiplied by b and added to the other to obtain the binary result. This technique converts one digit to binary for each clock cycle, but as can be seen, adds significant complexity in control logic.

Additionally, multipliers are usually implemented with limited width in order to preserve their speed. For example, whereas one multiplicand may be 32 bits wide, the other may be limited to 8 bits with width. Since the wider multiplicand must be reserved for the previous accumulation, the smaller input must be used for the number $b^2$. This limits the radix from which the conversion is made to $b=15$, for an 8-bit wide multiplicand.

Many algorithms have been developed for conversion from binary to radix-b, as well. One such algorithm, which is particularly useful with the present invention, is described in U.S. Pat. No. 3,803,392 to Amdahl and Clements. It involves first multiplying the binary number by a small constant $b^{-m}$ to create a product having an integer part and a fractional part. If m is chosen to be equal to $n-1$, where n is the maximum number of radix-b digits which may be obtained from the binary number, then the integer part of the product already contains the high-order digit of the radix-b number. The fractional part is then successively multiplied by b to generate a new radix-b digit in the integer part after every multiplication. As the digits are generated they are shifted into a final result register and the integer part cleared for the next digit.

For conversion of a 32-bit binary number into a 10-digit decimal number, the conversion may be performed in two stages. In the first stage, the initial multiplication is by $10^{-4}$ to obtain a first product. The integer portion of the first product is stored, and the fractional part is used to generate the low-order four digits of the result. Then, only if the integer part is nonzero, the high-order six digits are obtained by multiplying the integer portion of the first product by $10^{-5}$. The high-order six digits are then generated as above. This variation speeds up conversion of binary numbers less than 10,000 at the slight expense of conversion of numbers greater than or equal to 10,000. Like the convert-to-binary algorithm described above, however, both the one-stage version and the two-stage version of this algorithm require the services of a multiplier. Since the result of each multiplication is needed before the next one begins, two clock cycles are required to generate each radix-b digit.

It may be possible to speed the above conversion algorithms by using a highly integrated general purpose combinational multiplier to perform the iterative multiplications. This is usually not an option in a high-speed mainframe computer system, however, in which various technical and business considerations dictate that all logic be implemented in the same technology. Additionally, presently available multipliers may still be too slow to perform in one clock cycle at the clock frequencies used in high-speed mainframe computer systems. The clock frequency may be slowed enough to accommodate the longer delays inherent in such combinational multipliers, such that each multiplication is performed in one clock cycle, but the slower clock frequency would significantly degrade the throughput of the system as a whole even if it does provide a net increase in the speed at which conversions are performed.

SUMMARY OF THE INVENTION

It is therefore an object of the present invention to provide apparatus and a method for converting numbers between binary and another radix which alleviates the above problems.

It is another object of the present invention to provide apparatus which performs a conversion to binary at the rate of one radix-b digit for each clock cycle.

It is another object of the present invention to provide apparatus which performs a conversion from binary to radix-b which generates one radix-b digit per clock cycle.

It is another object of the present invention to accomplish the above objects without slowing the clock frequency.

It is another object of the present invention to accomplish the above objects with a minimum amount of additional hardware.

The above objects and others are accomplished according to the invention by providing dedicated convert hardware as a separate functional unit operating independently from any general purpose multiplier. The dedicated convert hardware comprises a special purpose multiply-and-add unit and a convert register. The output of the multiply-and-add unit is coupled to the input of the convert register, and the output of the convert register is recycled to the inputs of the multiply-and-add unit. The multiply-and-add unit is hardwired to multiply the input by b and concurrently add the value at a separate digit input. Means are also provided for initializing the convert register with zero or with any desired number.

The convert hardware is operated to convert a number from radix-b to binary by first initializing the convert register to zero and then iteratively clocking the multiply-and-add unit output into the convert register while presenting to the digit input of the multiply-and-add unit successively high- to low-order digits of the radix-b number.

The convert hardware is operated to convert a binary number to radix-b by first initializing the convert register with the fractional part of a product $N*b^{-m}$, where N is the binary number and m is an integer greater than zero as described above, and then repetitively clocking the output of the multiply-and-add unit into the convert register while the digit input of the multiply-and-add unit is held at zero. The integer part of each successive multiplication constitutes the successive radix-b digits. These may be shifted into a result register immediately, or stored temporarily in unused high-order bits of the convert register. Only the fractional part of each product is recirculated to the multiply-and-add unit, effectively clearing the integer part each cycle.

In the special case of conversion of numbers between binary and decimal (i.e., b=10), the multiply-and-add unit may be a combinational 3-input adder having first, second and third inputs. The first input is supplied with a version of the convert register output shifted left by one bit and the second input is supplied with a version of the convert register output shifted left by three bits. Since a one-bit left shift of a binary number is effectively a multiplication by two, and a 3-bit left shift of a binary number is effectively a multiplication by eight, the addition of the first and second input values is effectively a multiplication by 10. The connection between the convert register output and the first and second inputs of the adder therefore effectively converts the adder into a dedicated unit for performing high speed multiplication by 10.

Unlike the general purpose multiplier of the prior art, the dedicated multiply-and-add unit of the present invention requires a minimal number of logic levels to implement, and may therefore be made fast enough to operate in one clock cycle. Additionally, it will now be apparent that conversions of numbers between binary and another radix $b \neq 10$ may be performed using similar hardwired connections between the convert register output and inputs of a combinational adder (or subtractor, if appropriate), with left shifts appropriate for the value of b.

Moreover, the dedicated convert hardware of the present invention requires only a minimal amount of additional logic, because the same logic is used for conversions in both directions. Algorithms have been chosen for performing the conversions which both employ iterative multiplication by b. For conversions from radix b to binary, the third input of the dedicated multiply-and-add unit is supplied with successive high- to low-order digits of the radix-b number and the absolute value of the resulting binary number is iteratively calculated in the low-order bits of the convert register. For conversions from binary to radix b, the fractional part of the $b^{-m}$ product is initialized into the very same convert register, and recycled through the very same multiply-and-add unit to iteratively generate digits of the radix-b number. It can be seen that the dedicated hardware of the present invention and the use of such hardware to perform high speed radix conversions in both directions is a significant advance over the prior art.

DETAILED DESCRIPTION

Figure 1:
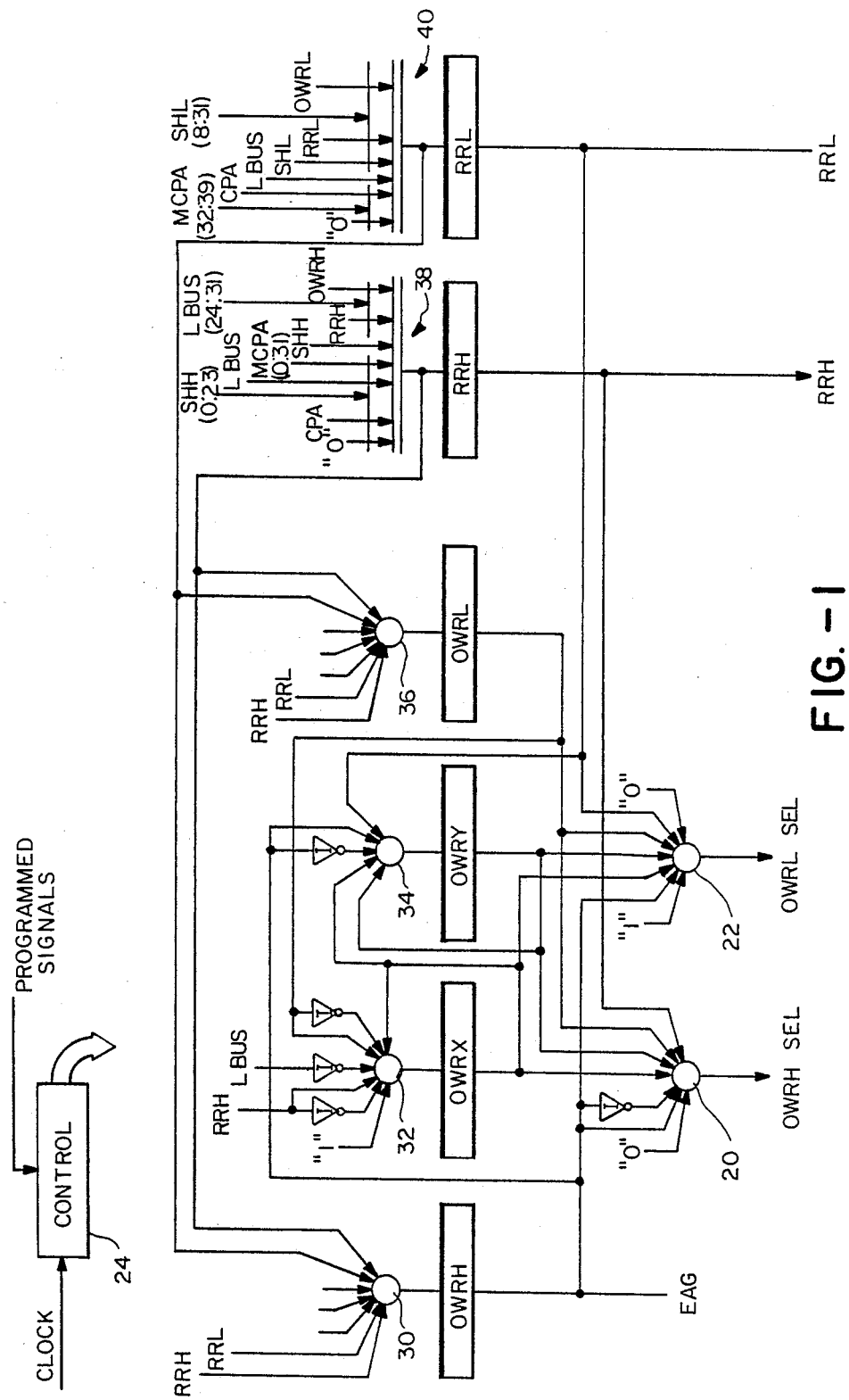
FIGS. 1-3 show various functional units of a data processing unit in which the invention may be used.

Additional objects and features of the invention will appear from the following description in which the preferred embodiments of the invention have been set forth in detail in conjunction with the drawings.

An embodiment of the invention will be described with reference to a data processing system having an IBM System/370 type architecture. For purposes of this description, the radix-b number will be considered to be decimal, and the apparatus and method will be described specifically for conversions between binary and decimal. It will be understood, however, that the invention applies equally to conversions between binary and other bases.

Computer systems based on the IBM System/370 include a CVB instruction to convert a decimal number into binary and a CVD instruction to convert a binary number into decimal. The binary numbers for both instructions are 32 bits wide in twos-complement form. They can represent values in the range of −2,147,483,648 to +2,147,483,647. The leftmost bit of the binary number is the sign bit. If it is zero, then the binary number is zero or positive and the rightmost 31 bits represent the absolute value of the number. If the sign bit is set, then the number is negative and its asolute value may be obtained by complementing all 32 bits and adding one.

For the purposes of the CVB and CVD instructions, decimal numbers are stored in 64-bit double words, the high order 60 bits of which contain 15 decimal digits of the absolute value of the number and the low order four bits of which contain a sign code to indicate whether the number is positive or negative. For the purposes of this description, it is sufficient to note that a sign code of 1100 indicates that the number is positive and a sign code of 1101 indicates that the number is negative.

Any 32-bit binary number may be converted to the decimal form described above, but a decimal number must be within the range of −2,147,483,648 to +2,147,483,647 to be converted into a 32-bit binary number. Additionally, no 4-bit numeric digit of the decimal number may contain a value greater than 9. If CVB encounters a decimal number with valid digits and sign codes, but with an absolute value larger than that which can be represented by a 32-bit binary number, then a fixed-point divide exception is recognized and only the low-order 32 bits of the binary result are generated. If CVB encounters a decimal number with an invalid digit or sign code, then a data exception is recognized and the execution of the instruction is terminated or suppressed.

Figure 2:
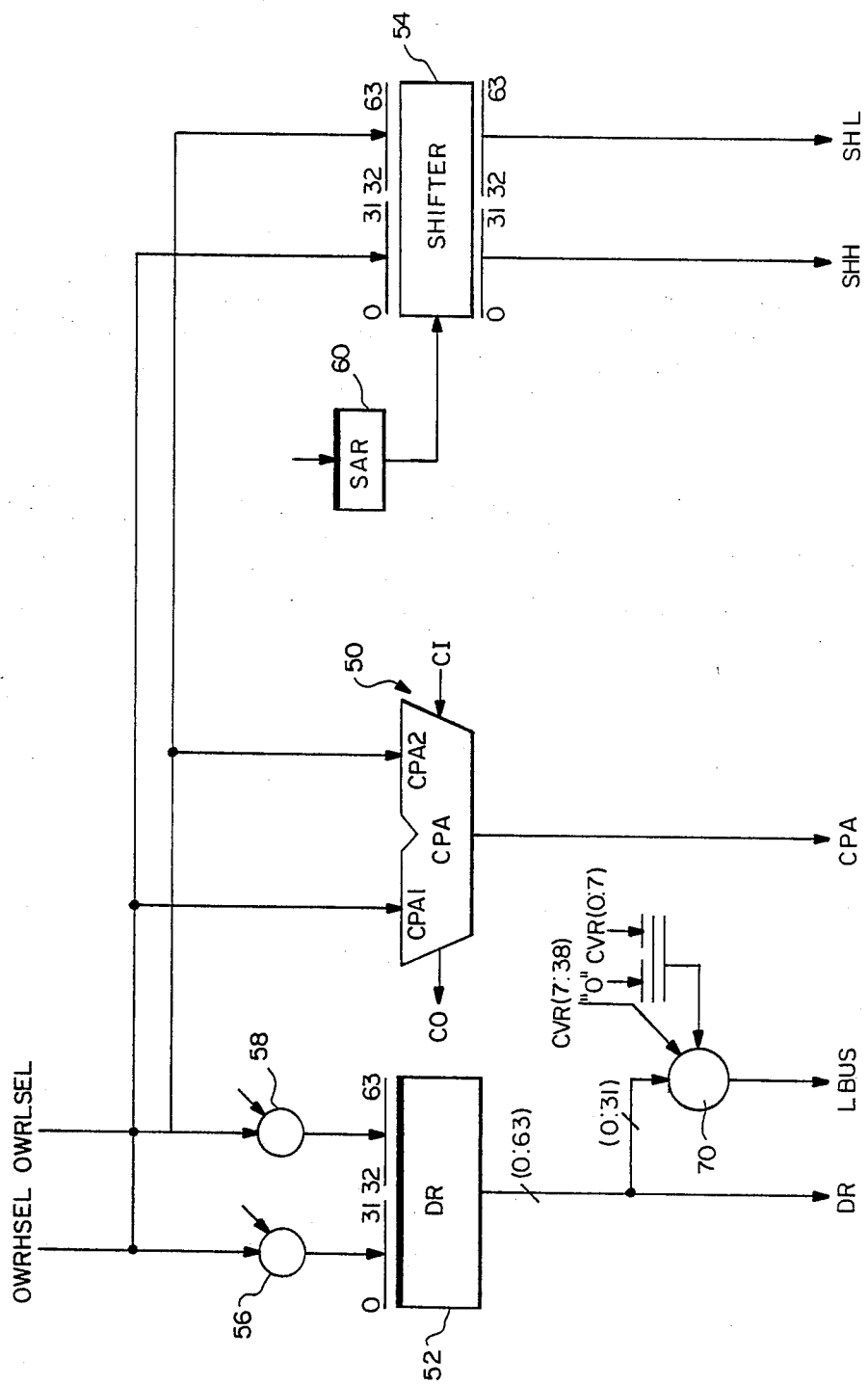
Figure 3:
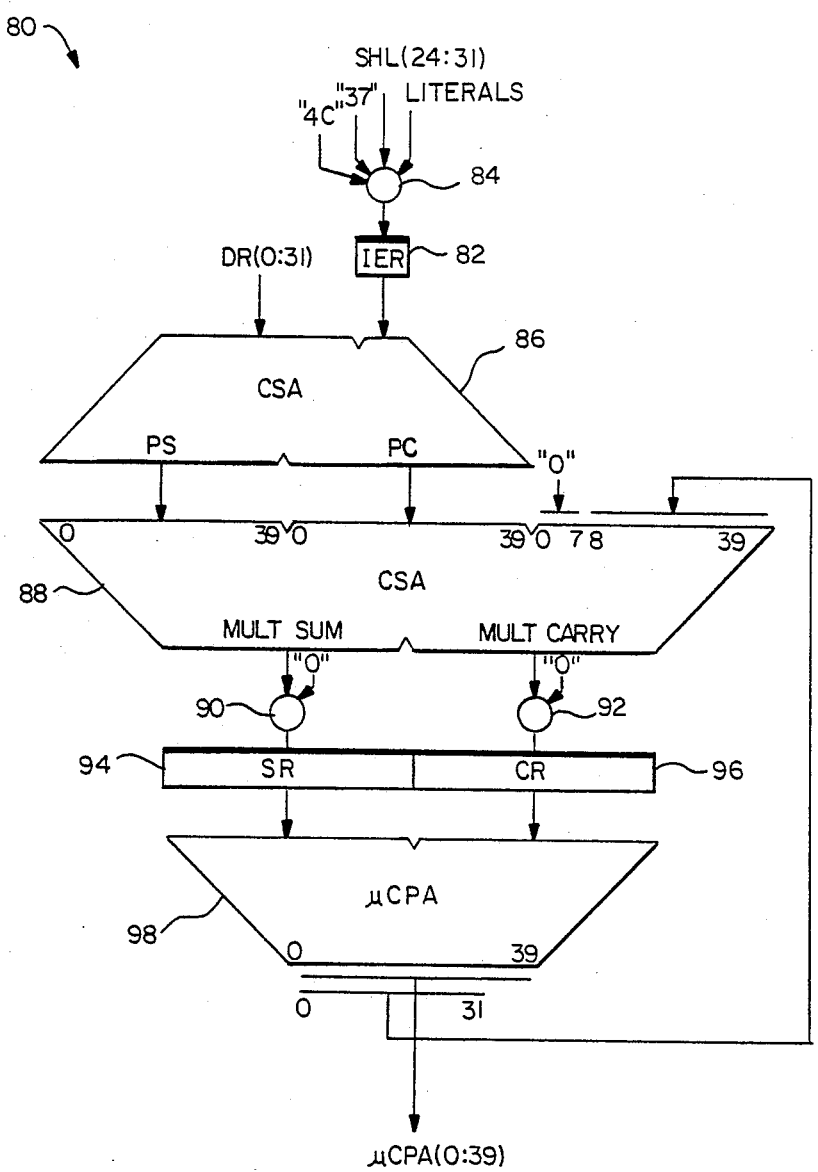

According to the invention, specialized convert hardware is provided which operates as part of a large and powerful computing system, relevant parts of which are shown in FIGS. 1-3. The implementation herein described is that used in a fixed point processing unit (FXU). Referring to FIG. 1, six 32-bit registers are shown, labelled OWRH, OWRX, OWRY, OWRL, RRH and RRL. Registers OWRH and OWRL receive data from other parts of the computing system for processing by the FXU. Registers RRH and RRL hold results from the various functional units in the FXU. Registers OWRX and OWRY hold data temporarily; they are not directly connected outside the FXU.

Also shown in FIG. 1 are two 32-bit buses labelled OWRHSEL and OWRLSEL. Two data selectors 20 and 22 are used to select data onto OWRHSEL and OWRLSEL, respectively. Reading from left to right, the data selector 20 may select any one of the following: a word of all zeros; the output of OWRH; the logical complement of OWRH; the output of OWRX; the output of OWRY; the output of OWRL; or the output of RRH. Data selector 22 may select a word of all ones; the output of OWRH; the output of OWRX; the output of OWRY; the output of OWRL; the output of RRL; or a word of all zeros. The selection performed by data selectors 20 and 22, as well as that performed by other data selectors to be described, is accomplished according to control signals generated by a control unit 24. The control unit 24 may be microcoded or hardwired, and it updates the control signals once every clock cycle. Programmed signals may be presented to the control unit 24 from an Instruction Unit, for example, which tells the FXU to perform a given machine level instruction, such as CVB or CVD.

The frequency at which the control unit 24 updates its control signals output is referred to as the clock cycle time of the FXU. In general, the cycle time can be no faster than the longest data path between two latch points in the computer system. Otherwise, the usual practice is either to slow the clock frequency, which degrades the throughput of the entire computer system as previously described, or divide the longest data paths into two or more segments by inserting additional intermediate latch points. For data paths passing through multipliers the latter solution is most often used, with the consequent disadvantages described above.

Also shown in FIG. 1 are six additional data selectors 30, 32, 34, 36, 38, and 40, for selecting data respectively to the registers OWRH, OWRX, OXRY, OWRL, RRH and RRL. Data selector 30 can select any of several inputs, including the output of RRH; the output of RRL; the output of data selector 40; or the output of data selector 38. Data selector 32 can select a word of all ones; the true or complement of the output of RRH; the complement of another FXU bus called the L Bus (described below); the output of OWRX; or the true or complement output of OWRL. Data selector 34 can select the output of OWRX; the output of OWRY; the output of RRL; or the true or complement of the output of OWRH. Data selector 36 can select from several inputs, including RRH; RRL; the output of data selector 40 or the output of data selector 38.

Data selector 38 can select a 32-bit word from any of the following: a word of all zeros, the output of a general purpose carry propagate adder (CPA) 50 shown in FIG. 2, the L Bus, the high-order 32 bits of the 40-bit output of a general purpose multiplier (MCPA) described below, a 32-bit SHH signal described below, the output of OWRH, the output of RRH, or a composite formed by bits 0-23 of SHH in the high-order 24 bits and bits 24-31 of L Bus in the low-order 8 bits.

Data selector 40 may select a 32-bit word from any of the following: a word of all zeros, CPA, L Bus, the output of an SHL register described below, OWRL, RRL or a composite formed by bits 32-39 of the 40-bit MCPA signal in the high-order 8 bits and bits 8-31 of SHL in the low-order 24 bits.

Referring to FIG. 2, several of the functional units of the FXU which are used in the radix conversion algorithms are shown. They include a 64-bit divide register (DR) 52, the previously mentioned carry propagate adder 50 and a 64-bit shifter 54. The divide register 52 is part of a fixed-point division functional unit, not shown, which is not otherwise important to the present invention. The inputs to DR 52 are selected in two 32-bit portions, the high-order 32 bits being selected by a data selector 56 and the low-order portion being selected by data selector 58. Both data selectors 56 and 58 are controlled by the same set of control signals (not shown). The data selector 56 selects data from either the OWRHSEL bus or another source (not shown). The data selector 58 selects data from either the OWRLSEL bus or another source (not shown). The other sources (not shown) for data selectors 56 and 58 are not used with the present invention.

CPA 50 is a 32-bit adder, capable of adding two 32-bit numbers CPA1 and CPA2. CPA1 is connected to OWRHSEL and CPA2 is connected to OWRLSEL. The output of CPA 50 is connected to the data selectors 38 and 40 (FIG. 1) as previously described. CPA 50 also has a carry input CI and carry output CO.

The shifter 54 shifts 64 bits of data from OWRHSEL and OWRLSEL by up to 63 bits in either direction. The shift amount and direction is loaded in the previous cycle into a Shift Amount Register (SAR) 60. The high-order 32 bits of the output of shifter 54 go to SHH, and the low-order 32 bits of shifter 54 go to SHL. As previously described, SHH may be selected into RRH and SHL may be selected into RRL. Shifts may be logical or arithmetic, but only logical shifts are used in the present embodiment.

Also shown in FIG. 2 is a data selector 70, which selects a 32-bit word for the L Bus. The data may be selected from the high-order 32 bits of DR register 52; the low-order 32 bits of of a 39-bit CVR convert register 110 (shown in FIG. 4) described below; or a word made up of the high-order 8 bits of CVR register 110 in the low-order 8 bits and zeros in the high-order 24 bits. Other sources (not shown) may also be selected onto the L Bus.

In FIG. 3 there is shown a general purpose binary multiplier 80 which forms another functional unit of the FXU. The multiplier 80 is capable of multiplying a 32-bit binary number by an 8-bit multiplicand, but contains data paths such that larger multiplicands may be used if iterative multiplication is acceptable. The multiplier 80 consists of an 8-bit IER register 82 for holding the smaller multiplicand, into which may be selected (by a data selector 84) the low-order 8 bits of SHL, the hex numbers 4C or 37, or another number supplied as a literal from the control means 24. The output of IER register 82 is connected to one input of a carry save adder (CSA) 86, the other input of which is connected to the high-order 32 bits of DR. The CSA 86 generates a partial sum (PS) and a partial carry (PC), each 40 bits wide, which are coupled respectively to first and second inputs of another CSA 88. CSA 88 also has a third 40-bit input, the high-order eight bits of which are supplied with all zeros, and the low-order 32 bits of which are connected as described below. CSA 88 generates a 40-bit MULT SUM and a 40-bit MULT CARRY signal. These are coupled to respective data selectors 90 and 92, the outputs of which are connected to the inputs of, respectively, a sum register (SR) 94 and a carry register (CR) 96. The data selectors 90 and 92 can also each select a 40-bit word of all zeros. The outputs of SR register 94 and CR register 96 are added together by a multiplier carry propagate adder (MCPA) 98. The high-order 32 bits of the output of MCPA 98 recirculate and supply the low-order 32 bits of the third input of CSA 88. As previously described with respect to FIG. 1, the high-order 32 bits of the 40-bit MCPA output is selectable into RRH, and the low-order 8 bits of the 40-bit MCPA output is selectable into RRL.

To multiply two 32-bit numbers using general purpose multiplier 80 to obtain a 64-bit product in RRH and RRL, the first operand is loaded into the leftmost 32 bits of DR and the low-order eight bits of the other operand are loaded into IER register 82. Zeros are loaded into SR register 94 and CR register 96. In each of the next three cycles, the output of CSA 88 is loaded into SR register 94 and CR register 96; the next eight bits of the second operand are loaded into IER register 82; whatever was previously in RRL is shifted right by eight bits; and bits 32-39 of MCPA are loaded into bits 0-7 of RRL. In the final cycle, RRL is shifted right by 8 bits; bits 32-39 of MCPA are loaded into bits 0-7 of RRL; and bits 0-31 of MCPA are loaded into RRH.

Figure 4:
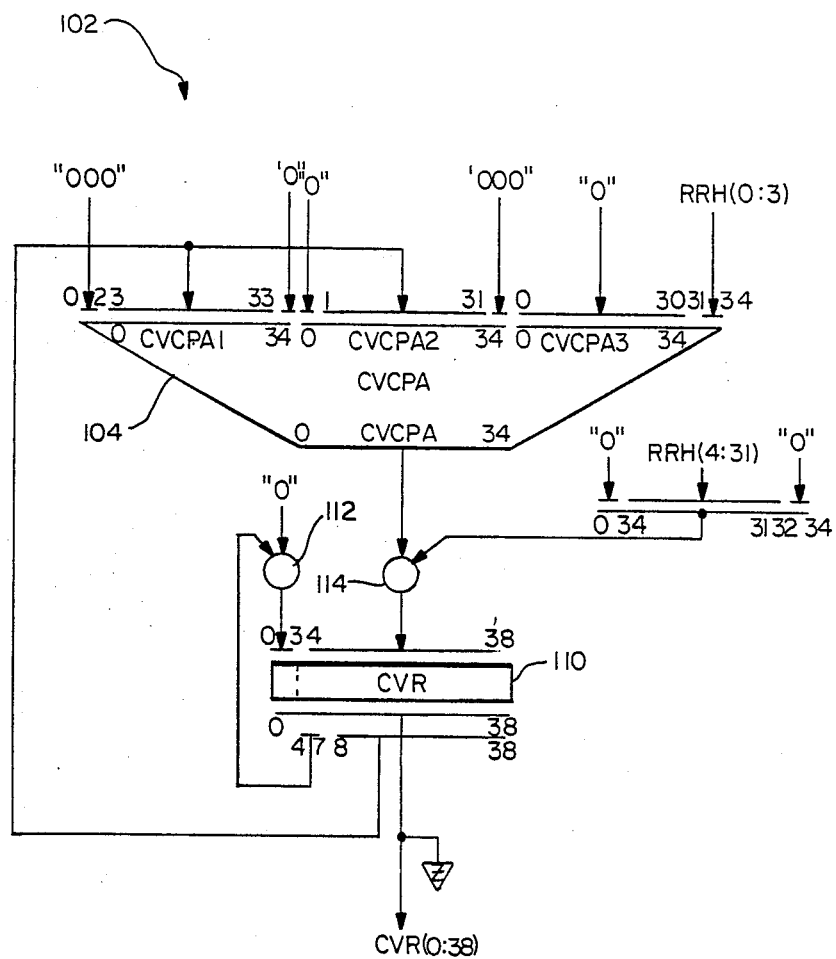
FIG. 4 shows apparatus which may be used with the apparatus of FIGS. 1-3 to implement the invention for bidirectional conversion between binary and decimal.

In FIG. 4 there is shown specialized convert hardware 102 according to the invention for bidirectionally converting numbers between binary and decimal. It consists of a three-input carry propagate adder (CVCPA) 104, a convert register (CVR) 110, and two data selectors 112 and 114. The three inputs of CVCPA 104 (CVCPA1, CVCPA2 and CVCPA3) are each 35 bits wide. The first and second of these are connected as described below. The third input of CVCPA 104 has its low-order four bits connected to the high-order four bits of RRH. The high-order 31 bits of the input are provided with all zeros. The 35-bit output of CVCPA 104 is coupled to the data selector 114, the output of which is connected to the low-order 35 bits of CVR register 110. Data selector 114 may also select a 35-bit word consisting of zeros in bits 0-3 (appearing in bits 4-7 of CVR), the low-order 28 bits of RRH in bits 4-31 (appearing in bits 8-35 of CVR) and zeros in bits 32-34 (appearing in bits 36-38 of CVR).

CVR register 110 is a 39-bit register, the output of which may be coupled to the L Bus as previously described by data selector 70 (FIG. 2). Additionally, the low-order 31 bits of CVR are recirculated and connected to the first and second inputs of CVCPA 104. The connection to CVCPA1 is shifted left by one bit, such that CVR bit 38 is connected to CVCPA1 bit 33; CVR bit 37 is connected to CVCPA1 bit 32; and so on until CVR bit 8 is connected to CVCPA1 bit 3. CVCPA1 bits 34 and 0-2 are held at 0. In effect, therefore, the value at the CVCPA1 input is equal to two times the value in CVR bits 8-38.

Similarly, the connection to the second input of CPA is shifted left by three bits. In effect, therefore, the value at CVCPA2 is equal to 8 times the value in CVR bits 8-38. Since CVCPA adds twice the value in CVR(8:38) to 8 times the value in CVR(8:38), CVCPA 104 effectively generates 10 times CVR(8:38) (plus the value at CVCPA3) in a fast, hardwired, combinational manner. It can be seen that if b is different from 10, another hardwired configuration such as this may be used to generate b times CVR(8:38).

Finally, CVR bits 4-7 are connected through a four-bit data selector 112 to the CVR inputs for bits 0-3. Data selector 112 can also select four bits of zeros to present to the inputs for CVR bits 0-3. It will be shown below that CVR register 110 is wider than absolutely necessary to perform conversions, since only the low-order 32 bits are used in conversions to binary, and though all of the 32 low-order bits are used to perform conversions to decimal, only bits 8-29 are necessary. The high-order eight bits of CVR register 110 are used only for temporarily storing pairs of BCD digits as they are generated by the convert hardware 102.

The operation of the apparatus shown in FIGS. 1-4 for conversion of numbers from decimal to binary is set out in detail in Appendix I. In general, the procedure begins by left-justifying the significant digits (i.e., the digits that are not leading zeros) of the 64-bit decimal operand in RRH and RRL, and by loading zero into CVR register 110. A loop is then entered in which each iteration adds the leading decimal digit in RRH to 10 times the accumulation in CVR register 110 while RRH and RRL are shifted left by one decimal digit position. At the end of this iteration, the binary number is in the low-order 32 bits of CVR register 110.

The operation of the apparatus for conversion of binary numbers to decimal is set out in detail in Appendix II. In general, the procedure is similar to that described in the background section above. As described, one way of implementing the algorithm would be to multiply the binary number by a binary fraction which represents $10^{-9}$. Since the absolute value of the largest possible binary number is 2,147,483,648, the product would be a number with an integer part of at most 2 (i.e., guaranteed to fit within one digit) and a fractional part.

The decimal result would consist of five leading zero digits followed by one digit obtained from the integer part of the product, followed by nine digits obtained from computations on the fractional part of the product. The computations on the fractional part consist of a loop in which each iteration multiplies the fraction by 10. The integer part of the product from each of these iterative multiplications forms another digit of the decimal number, and the fractional part is used by the next iteration of the loop.

According to an aspect of the invention, the conversion process is divided into two stages in the belief that most numbers which are converted are relatively small. This procedure speeds up the conversion for numbers with an absolute value of less than 1000, but it makes the conversion of larger numbers a little slower. First, the binary number is multiplied by $10^{-3}$ to obtain a first product. If the integer part of the first product is zero, then the procedure for numbers less than 1000 is followed: three decimal digits are generated from the fractional part by iterative multiplication by 10; twelve leading zero digits are appended to the left; and the sign code is appended to the right. If the integer part of the first product is not zero, then the procedure for numbers greater than or equal to 1000 is followed. Three decimal digits are generated from the fractional part of the first product by iterative multiplication by 10, and the sign is appended to the right; these three digits and sign are saved left justified in OWRX. The integer part of the first product is then multiplied by $10^{-6}$ producing a second product with a second integer part and a second fractional part. The new integer part has a value of at most two. Six decimal digits are generated from the second fractional part by iterative multiplication by 10. The final result consists of 5 leading zero digits, followed by the second integer part (1 digit), followed by the 6 digits generated from the second fractional part, followed by the 3 digits generated from the fraction part of the first product, followed by the sign code.

It can be seen that the two stages need not be divided into 3 digits and 6 digits; any division will suffice. The choice of 3 digits and 6 digits is a departure form the prior art.

The number used to represent $10^{-3}$ in base 16 notation is '0.004189374C'. Actually, this number is slightly larger than $10^{-3}$ (and '0.004189374B' is slightly smaller than $10^{-3}$). The number used to represent $10^{-6}$ in base 16 notation is '0.000010C6F8'. Actually this number is slightly larger than $10^{-6}$ (and '0.000010C6F7' is slightly smaller than $10^{-6}$). Since both of the numbers used are slightly larger than the values that they represent, small errors are introduced into the calculation. Furthermore, the fractional parts of the products so computed are rounded up to the next value that fits into 28 bits, thereby introducing additional small errors. Appendix III shows, however, that these errors have no effect on the accuracy of the result.

It will be seen that, like the conversion from decimal to binary, not all of the CVR register 110 is used in the conversion from binary to decimal. Only 28 bits of CVR (bits 8-35) are loaded with the fractional parts of the first and second products (the results of multiplication by $10^{-3}$ and $10^{-6}$). Actually, for b=10 and for the 2-stage division of $10^{-3}$ and $10^{-6}$, sufficient precision would be obtained if only 22 bits (bits 8-29) of CVR were used to hold the fractional parts. Similarly, though 32 bits (CVR(7:38)) are loaded with the fractional part of each iteration multiplication result (CVCPA), only 22 of those bits are needed to achieve the necessary precision.

On the high-order end of CVR register 100, the low-order four bits of the integer part of the multiplication by $10^{-6}$ and of the iterative multiplications are placed in CVR(4:7). That information is shifted over to CVR(0:3) each cycle to make room for the integer portion of a new product. For neither of those purposes, however, is it essential that CVR(0:7) actually be part of the same register as CVR(8:38): the low-order four bits of the integer portion of the $10^{-6}$ multiplication result contain the first decimal digit, which may instead be stored elsewhere since no further processing of such digit is required; and the low-order four bits of the integer portion of each iteration multiplication contains a different decimal digit which also needs no further processing and which may likewise be stored elsewhere or immediately shifted into a result register. CVR(4:7) is also used to detect data overflow in CVB, but this function may be performed at the output of CVCPA 104. The use of temporary storage means appended to the high-order end of CVR register 110 is merely a convenient way, given the architecture and data paths of the FXU, for temporarily storing the above information.

It will be understood that the above-described embodiment is merely illustrative of many specific embodiments which can represent the principles of the invention. Numerous and varied other arrangements can readily be devised in accordance with these principles without departing from the spirit and scope of the invention. Thus, the foregoing description is not intended to limit the invention which is defined by the appended claims.

APPENDIX I

CONVERSION FROM DECIMAL TO BINARY
COPYRIGHT 1986 AMDAHL CORPORATION

Setup

Load decimal operand into OWRH and OWRL with the most significant digits in OWRH First Cycle OWRH → OWRY
OWRL → OWRX
OWRH → OWRHSEL
OWRL → OWRLSEL
Number of leading zero digits in OWRSEL → COUNTER1
"LEFT (4 times number of leading zero digits)" → SAR
0 → RRH (will be used to clear CVR on next cycle)
0 → RRL
0 → OVERFLOW_TRIGGER
If all digits (except sign digit) in OWRSEL are zero,
    then set ZERO_TRIGGER (operand is zero)
otherwise, reset ZERO_TRIGGER (operand is nonzero)

Second Cycle

OWRY → OWRHSEL
OWRX → OWRLSEL
Execute logical shift to eliminate leading zero digits
SHH → RRH
SHL → RRL
  (Significant digits are now left justified in
  RRH/RRL)
COUNTER1 -15 → COUNTER1 (to put number of
  significant digits into COUNTER1)
0 → CVR<0:7>; RRH<4:31> → CVR<8:35>;
  0 → CVR<36:38> (Clear CVR. ZERO was put in RRH
  in previous cycle)
"LEFT 4" → SAR (for moving next decimal digit into
  place in the next cycle)
Hold OVERFLOW_TRIGGER
Decode decimal sign code from OWRLSEL<28:31>
  If sign code is negative, then set SIGN1_TRIGGER
  If sign code is positive, then reset
    SIGN1_TRIGGER
If ZERO_TRIGGER is set,
  then branch to "Next to Last Cycle (Zero Result)"

Looping Cycle

CVR shifted left 1 bit → CVCPA1
CVR shifted left 3 bits → CVCPA2
RRH<0:3> → CVCPA3 (right justified)
CVCPA → CVR<4:31> (CVCPA is 10*CVR<8:38> +
  RRH<0:3>)
CVR<4:7> → CVR<0:3> (happens automatically each clock
  cycle but makes no difference for conversion to
  binary)
RRH → OWRHSEL
RRL → OWRLSEL
Execute logical shift to move next decimal digit into
  place
"LEFT 4" → SAR (to prepare for logical shift on next
  repetition of this cycle)
If CVR<4:7> = 0 then set OVERFLOW_TRIGGER
  else hold OVERFLOW_TRIGGER (CVR<4:7> will be
  nonzero only if original decimal number was
  too large)
Hold SIGN1_TRIGGER
Decrement COUNTER1
If COUNTER1 (before the decrement) > 1, repeat this
cycle Next to Last Cycle (Nonzero Result)

CVR<7:38> → L_BUS (through data selector 70 (FIG. 2))

APPENDIX I-continued
CONVERSION FROM DECIMAL TO BINARY
COPYRIGHT 1986 AMDAHL CORPORATION L_BUS → RRH
  L_BUS → OWRX (prepare to complement and add 1 if
    result was negative)
If CVR<4:6> = 0, then set OVERFLOW_TRIGGER
If (CVR<7> = 0 and CVR<8:38> =0), then set
  OVERFLOW_TRIGGER
If (CVR<7> = 0) and SIGN1_TRIGGER is not set)
  then set OVERFLOW_TRIGGER
If OVERFLOW_TRIGGER is already set, then leave it set
If SIGN1_TRIGGER is set,
  then branch to "Last Cycle (Negative Result)"
  else branch to "Last Cycle (Positive Result)"
Notify other units of computer that execution of this
  instruction is almost finished
Last Cycle (Positive Result)
Hold RRH
OVERFLOW_TRIGGER →
          FIXED_POINT_DIVIDE_INTERRUPT
Last Cycle (Negative Result)
OWRX → OWRHSEL
0 → OWRLSEL
1 → CPA_CARRY_IN
CPA → RRH
OVERFLOW_TRIGGER →
          FIXED_POINT_DIVIDE_INTERRUPT
Next to Last Cycle (Zero Result)
Notify other units of computer that execution of this
  instruction is almost finished
Last Cycle (Zero Result)
0 → RRH

APPENDIX II
CONVERSION FROM BINARY TO DECIMAL
COPYRIGHT 1986 AMDAHL CORPORATION

Setup
Load binary operand into OWRL
Cycle 1
  OWRL → OWRX (Need this if operand negative)
  OWRL → OWRHSEL
  OWRHSEL → DR<0:31> (DR<0:31> contains one operand for
    binary multiplier 80)
  '4C'X → IER (Low-order byte of $10^{-3}$ becomes other
    operand for binary multiplier 80)
  0 → SR
  0 → CR
  If OWRHSEL=0 then set ZERO_TRIGGER
    else reset ZERO_TRIGGER
  If OWRHSEL<0> is set, then branch to Cycle 50 (operand
    is negative)
Note:
Cycles 2-6 do setup work for positive operands, including multiplication by $10^{-3}$
and building the positive sign code. Cycles 50-56 do setup work for negative
operands, including calculating the absolute value of the operand, multiplication by
$10^{-3}$ and building the negative sign code.
Cycle 2
  ONES → OWRX (Need this if operand zero)
  MULTIPLY_SUM → SR
  MULTIPLY_CARRY → CR
  '37'X → IER (Next byte of $10^{-3}$)
  DR → DR
  "LEFT 30" → SAR
  If ZERO_TRIGGER is set, then branch to Cycle 90
    (operand was zero)
Cycle 3
  OWRX → OWRHSEL
  Shift left 30 bits (to build positive sign code)
  SHH → RRH (Positive sign code → RRH<0:3>)
  MCPA<32:39> → RRL<0:7> (Low-order 8 bits of product)
  MULTIPLY_SUM → SR
  MULTIPLY_CARRY → CR
  '89'X → IER (next byte of $10^{-3}$)
  DR → DR
  "RIGHT 8" → SAR
Cycle 4
  RRH → OWRX (Positive sign code → OWRX<0:3>)
  RRL → OWRLSEL

APPENDIX II-continued
CONVERSION FROM BINARY TO DECIMAL
COPYRIGHT 1986 AMDAHL CORPORATION Shift completed part of product right 8 bits
SHL<8:31> → RRL<8:31>
MCPA<32:39> → RRL<0:7>
MULTIPLY_SUM → SR
MULTIPLY_CARRY → CR
'41'X → IER (next byte of $10^{-3}$)
DR → DR
"RIGHT 8" → SAR
Cycle 5
  OWRX → OWRX (Positive sign code in OWRX<0:3>)
  RRL → OWRLSEL
  Shift completed part of product right 8 bits
  SHL<8:31> → RRL<8:31>
  MCPA<32:39> → RRL<0:7>
  MULTIPLY_SUM → SR
  MULTIPLY_CARRY → CR
  '41'X → IER (next byte of $10^{-3}$)
  "RIGHT 8" → SAR
Cycle 6
  OWRX → OWRX (Positive sign code in OWRX<0:3>)
  RRL → OWRLSEL
  Shift completed part of product right 8 bits
  SHL<8:31> → RRL<8:31>
  MCPA<32:39> → RRL<0:7>
  MCPA<0:31> → RRH
  "LEFT 20" → SAR
    (Integer part of product is in RRH<0:23>)
    (Fractional part of product is in RRH<24:31> and
      RRL, but only RRH<24:31> and RRL<0:19> will
      be used)
Note:
Cycles 7-11 are shared by the <1000 case and the ≧ 1000 case.
Cycle 7
  OWRX → OWRY (Sign code → OWRY<0:3>)
  RRH → OWRX (Integer part of $10^{-3}$ Product →
    OWRX<0:23> for safekeeping)
  RRH → OWRHSEL
  RRL → OWRLSEL
  Shift left 20 bits (puts fractional part in RRH<4:31>)
  SHH → RRH
Cycle 8
  RRH → OWRHSEL
  0 → OWRLSEL
  1 → CPA_CARRY_IN
  CPA → RRH (Increment fractional part to make up for
    truncation)
  OWRX → OWRX (holding integer part of $10^{-3}$ product)
  OWRY → OWRY (Sign code in OWRY<0:3>)
  "RIGHT 8" → SAR
Cycle 9
  0 → CVR<0:7,36:38>
  RRH<4:31> → CVR<8:35>
  OWRY → OWRY (Sign code in OWRY<0:3>)
  OWRX → OWRHSEL
  Shift integer part right 8 bits to right justify it in
    RRH
  SHH → RRH (Also ensures that RRH<0:3> are zero for
    next cycle)
  If SHH = 0, then set ZERO_TRIGGER else reset
    ZERO_TRIGGER (ZERO_TRIGGER indicates that integer
    part is zero)
Cycle 10 (Generates 1st of 3 decimal digits)
  OWRY → OWRY (Sign code in OWRY<0:3>)
  RRH → OWRHSEL
  OWRHSEL → DR<0:31> (preparation for $10^{-6}$
    multiplication)
  CVR shifted left 1 bit → CVCPA1
  CVR shifted left 3 bits → CVCPA2
  RRH<0:3> → CVCPA3 (right justified; holds CVCPA3 at
    0)
  CVR<4:7> → CVR<0:3> (happens each cycle)
  CVCPA → CVR<4:38> (1st of 3 decimal digits →
    CVR<4:7>)
  0 → RRH
  "LEFT 4" → SAR
  Hold to ZERO_TRIGGER
Cycle 11 (Generates 2nd of 3 decimal digits)
  OWRY → OWRY (Sign code in OWRY<0:3>)

APPENDIX II-continued
CONVERSION FROM BINARY TO DECIMAL
COPYRIGHT 1986 AMDAHL CORPORATION DR → DR (holding integer part of $10^{-3}$ product for future $10^{-6}$ multiplication)
RRH → OWRHSEL
SHH<0:23> → RRH<0:23> (zero → RRH<0:23>)
CVR<0:7> → L_BUS<24:31>
L_BUS<24:31> → RRH<24:31> (1st of 3 digits → RRH<28:31>; zero → RRH<24:27>)
CVR shifted left 1 bit → CVCPA1
CVR shifted left 3 bits → CVCPA2
RRH<0:3> → CVCPA3 (right justified) (still being held at zero)
CVR<4:7> → CVR<0:3> (moves 1st digit over; will soon be overwritten since already in RRH)
CVCPA → CVR<4:38> (2nd of 3 decimal digits → CVR<4:7>)
"LEFT 4" → SAR
If ZERO_TRIGGER, then branch to Cycle 80 (<1000 case)
Cycle 12 (generates 3rd of 3 decimal digits)
OWRY → OWRY (Sign code in OWRY<0:3>)
RRH → OWRHSEL
Shift left 4 bits
SHH → RRH (1st of 3 decimal digits → RRH<24:27>)
CVR shifted left 1 bit → CVCPA1
CVR shifted left 3 bits → CVCPA2
RRH<0:3> → CVCPA3 (right justified) (still zero from cycle 10)
CVR<4:7> → CVR<0:3> (2nd of 3 decimal digits → CVR<0:3>; overwrites copy of 1st of 3 digits)
CVCPA → CVR<4:38> (3rd of 3 decimal digits → CVR<4:7>)
"LEFT 4" → SAR
DR → DR (holding integer part of $10^{-3}$ product)
'F8'X → IER (Low-order part of $10^{-6}$)
0 → SR
0 → CR
Cycle 13 (collects 3 decimal digits in RRH<20:31>)
OWRY → OWRY (Sign code in OWRY<0:3>)
RRH → OWRHSEL
Shift left 4 bits
SHH<0:23> → RRH<0:23> (shifts 1st decimal digit left to RRH<20:23>)
CVR<0:7> → L_BUS<24:31>
L_BUS<24:31> → RRH<24:31> (2nd and 3rd of 3 decimal digits → RRH<24:31>)
MULTIPLY_SUM → SR (begin multiplication by $10^{-6}$)
MULTIPLY_CARRY → CR (..)
'C6'X → IER (next byte of $10^{-6}$)
DR → DR
"LEFT 20" → SAR
Cycle 14
RRH → OWRHSEL (low-order 3 digits of result to shifter <20:31>)
OWRY → OWRLSEL (sign code to shifter <32:35>)
Shift left 20 bits
SHH → RRH (3 decimal digits and sign left-justified → RRH)
MCPA<32:39> → RRL<0:7> (Low-order 8 bits of 2nd product)
MULTIPLY_SUM → SR
MULTIPLY_CARRY → CR
'10'X → IER (next byte of $10^{-6}$)
DR → DR
"RIGHT 8" → SAR
Cycle 15
RRH → OWRX (3 decimal digits and sign left-justified → OWRX for temporary storage)
RRL → OWRLSEL
Shift right 8 bits
SHL<8:31> → RRL<8:31>
MCPA<32:39> → RRL<0:7> (next 8 bits of 2nd product)
MULTIPLY_SUM → SR
MULTIPLY_CARRY → CR
"RIGHT 8" → SAR
Cycle 16
OWRX → OWRX (holding 3 decimal digits and sign code)
RRL → OWRLSEL
Shift right 8 bits
MCPA<32:39> → RRL<0:7> (next 8 bits of 2nd product)

APPENDIX II-continued
CONVERSION FROM BINARY TO DECIMAL
COPYRIGHT 1986 AMDAHL CORPORATION SHL<8:31> → RRL<8:31>
MCPA<0:31> → RRH
"LEFT 12" → SAR
(Zero is in RRH<0:11>, integer part is in RRH<12:15>, fractional part to be used is in RRH<16:31>, RRL<0:11>)
Cycle 17
OWRX → OWRX (holding 3 decimal digits and sign code)
RRH → OWRHSEL
RRL → OWRLSEL
Shift left 12 bits
SHH → RRH (Integer part of $10^{-6}$ product → RRH<0:3>, fractional part → RRH<4:31>)
Cycle 18
OWRX → OWRX
RRH → OWRHSEL
0 → OWRLSEL
1 → CPA_CARRY IN,
CPA → RRH (Increment to make up for truncation)
"RIGHT 28" → SAR
Cycle 19 (1st of 7 decimal digits)
OWRX → OWRX
0 → CVR<0:7,36:38>
RRH<4:31> → CVR<8:35> (fractional part of second product)
RRH → OWRHSEL (integer part of second product)
Shift right 28 bits
SHH → RRH (1st of 7 decimal digits → RRH<28:31>) (also ensures RRH<0:27> are zeros for CVCPA3, below)
Note:
Cycles 20-25 generate one of the remaining 6 decimal digits each cycle in CVR<4:7>. They are peeled off in pairs every second cycle.
Cycle 20 (generates 2nd of 7 decimal digits)
OWRX → OWRX
CVR shifted left 1 bit → CVCPA1
CVR shifted left 3 bits → CVCPA2
RRH<0:3> → CVCPA3 (right justified) (held at zero)
CVR<4:7> → CVR<0:3>
CVCPA → CVR<4:38> (2nd of 7 decimal digits → CVR<4:7>)
RRH → RRH
"LEFT 4" → SAR
Cycle 21 (generates 3rd of 7 decimal digits)
OWRX → OWRX
CVR shifted left 1 bit → CVCPA1
CVR shifted left 3 bits → CVCPA2
RRH<0:3> → CVCPA3 (right justified) (still zero)
CVR<4:7> → CVR<0:3> (2nd of 7 decimal digits → CVR<0:3>)
CVCPA → CVR<4:38> (3rd of 7 decimal digits → CVR<4:7>)
RRH → OWRHSEL
Shift left 4 bits
SHH → RRH (1st of 7 decimal digits → RRH<24:27>)
"LEFT 4" → SAR
Cycle 22 (generates 4th of 7 decimal digits)
OWRX → OWRX
CVR shifted left 1 bit → CVCPA1
CVR shifted left 3 bits → CVCPA2
RRH<0:3> → CVCPA3 (right justified) (still zero)
CVR<4:7> → CVR<0:3>
CVCPA → CVR<4:38> (4th of 7 decimal digits → CVR<4:7>)
RRH → OWRHSEL
Shift left 4 bits
SHH<0:23> → RRH<0:23>
CVR<0:7> → L_BUS<24:31>
L_BUS<24:31> → RRH<24:31>
(1st 3 of 7 decimal digits now in RRH<20:31>)
"LEFT 4" → SAR
Cycle 23 (generates 5th of 7 decimal digits)
OWRX → OWRX
CVR shifted left 1 bit → CVCPA1
CVR shifted left 3 bits → CVCPA2
RRH<0:3> → CVCPA3 (right justified) (still zero)
CVR<4:7> → CVR<0:3> (4th of 7 decimal digits → CVR<0:3>)

APPENDIX II-continued
CONVERSION FROM BINARY TO DECIMAL
COPYRIGHT 1986 AMDAHL CORPORATION CVCPA → CVR<4:38> (5th of 7 decimal digits → CVR<4:7>)
RRH → OWRHSEL
Shift left 4 bits
SHH → RRH (1st 3 of 7 decimal digits now in RRH<16:27>)
"LEFT 4" → SAR
Cycle 24 (generates 6th of 7 decimal digits)
OWRX → OWRX
CVR shifted left 1 bit → CVCPA1
CVR shifted left 3 bits → CVCPA2
RRH<0:3> → CVCPA3 (right justified) (still zero)
CVR<4:7> → CVR<0:3>
CVCPA → CVR<4:38> (6th of 7 decimal digits → CVR<4:7>)
RRH → OWRHSEL
Shift left 4 bits
SHH<0:23> → RRH<0:23>
CVR<0:7> → L_BUS<24:31>
L_BUS<24:31> → RRH<24:31> (1st 5 of 7 decimal digits now in RRH<12:31>)
"LEFT 4" → SAR
Cycle 25 (generates 7th of 7 decimal digits)
OWRX → OWRX
CVR shifted left 1 bit → CVCPA1
CVR shifted left 3 bits → CVCPA2
RRH<0:3> → CVCPA3 (right justified) (still zero)
CVR<4:7> → CVR<0:3> (6th of 7 decimal digits → CVR<0:3>)
CVCPA → CVR<4:38> (7th of 7 decimal digits → CVR<4:7>)
RRH → OWRHSEL
Shift left 4 bits
SHH → RRH (1st 5 of 7 decimal digits now in RRH<8:27>)
"LEFT 4" → SAR
Cycle 26
OWRX → OWRX (still holding 3 decimal digits and sign code)
RRH → OWRHSEL
Shift left 4 bits
SHH<0:23> → RRH<0:23>
CVR<0:7> → L_BUS<24:31>
L_BUS<24:31> → RRH<24:31> (All 7 decimal digits now in RRH<4:31>)
"RIGHT 16" → SAR
Notify other units of computer that execution of this instruction is almost finished.
Cycle 27 (collects all 10 decimal digits and sign code)
RRH → OWRHSEL (High-order 7 digits right justified)
OWRX → OWRLSEL (Low-order 3 digits and sign left justified.)
Shift right 16 bits
SHH → RRH
SHL → RRL (decimal result now in RRH<20:31> and RRL<0:31>)
(End of algorithm if operand $\geq$ 1000)
Note:
Cycles 50-56 negate a negative operand, multiply by $10^{-3}$ and build the negative sign code.
Cycle 50
OWRX → OWRHSEL (complement of operand)
0 → OWRLSEL
1 → CPA_CARRY_IN
CPA → RRH (Two's complement of operand (absolute value of negative operand))
ONES → OWRX (for building negative sign code)
"LEFT 34" → SAR
Cycle 51
RRH → OWRHSEL
OWRX → OWRLSEL
OWRHSEL → DR<0:31> (set up absolute value of operand for multiplication by $10^{-3}$)
Shift left 34 bits
SHH → RRH ('FFFFFFFC' → RRH) (part of building sign code)
'4C'X → IER (low-order byte of $10^{-3}$)
0 → SR 0 → CR
Cycle 52
RRH → OWRHSEL
0 → OWRLSEL
1 → CPA_CARRY IN
CPA → RRH (Negative sign code → RRH<28:31>)
MULTIPLY_SUM → SR
MULTIPLY_CARRY → CR
'37'X → IER (next byte of $10^{-3}$)
DR → DR
"LEFT 28" → SAR
Cycle 53
RRH → OWRHSEL
Shift left 28 bits
SHH → RRH (Negative sign code → RRH<0:3>)
MCPA<32:39> → RRL<0:7> (Low-order 8 bits of 1st product)
MULTIPLY_SUM → SR
MULTIPLY_CARRY → CR
'89'X → IER (next byte of $10^{-3}$)
DR → DR
"RIGHT 8" → SAR
Cycle 54
RRH → OWRX (Negative sign code → OWRX<0:3>)
RRL → OWRLSEL
Shift completed part of product right 8 bits
SHL<8:31> → RRL<8:31>
MCPA<32:39> → RRL<0:7> (next 8 bits of 1st product)
MULTIPLY_SUM → SR
MULTIPLY_CARRY → CR
'41'X → IER (next byte of $10^{-3}$)
DR → DR
"RIGHT 8" → SAR
Cycle 55
OWRX → OWRX (Negative sign code in OWRX<0:3>)
RRL → OWRLSEL
Shift completed part of product right 8 bits
SHL<8:31> → RRL<8:31>
MCPA<32:39> → RRL<0:7> (next 8 bits of 1st product)
MULTIPLY_SUM → SR
MULTIPLY_CARRY → CR
'41'X → IER (next byte of $10^{-3}$)
"RIGHT 8" → SAR
Cycle 56
OWRX → OWRX (Negative sign code in OWRX<0:3>)
RRL → OWRLSEL
Shift completed part of product right 8 bits
SHL<8:31> → RRL<8:31>
MCPA<32:39> → RRL<0:7>
MCPA<0:31> → RRH
"LEFT 20" → SAR
(Integer part of product is in RRH<0:23>)
(Fractional part of product is in RRH<24:31> and RRL; only RRH<24:31> and RRL<0:19> will be used)
Branch to Cycle 7
(Cycles 80-82: case of 0 < operand < 1000)
Cycle 80 (generates 3rd of 3 decimal digits)
OWRY → OWRY (sign code in OWRY<0:3>)
RRH → OWRHSEL
Shift left 4 bits
SHH → RRH (1st of 3 decimal digits → RRH<24:27>)
CVR shifted left 1 bit → CVCPA1
CVR shifted left 3 bits → CVCPA2
RRH<0:3> → CVCPA3 (right justified) (still zero)
CVR<4:7> → CVR<0:3> (2nd of 3 decimal digits → CVR<0:3>)
CVCPA → CVR<4:38> (3rd of 3 decimal digits → CVR<4:7>)
"LEFT 4" → SAR
Cycle 81
OWRY → OWRY (sign code in OWRY<0:3>)
RRH → OWRHSEL
Shift left 4 bits
SHH<0:23> → RRH<0:23>
CVR<0:7> → L_BUS<24:31>
L_BUS<24:31> → RRH<24:31> (All 3 digits → RRH<20:31>)

APPENDIX II-continued
CONVERSION FROM BINARY TO DECIMAL
COPYRIGHT 1986 AMDAHL CORPORATION "RIGHT 28" → SAR
Notify other units of computer that execution of this instruction is almost finished

Cycle 82

RRH → OWRHSEL (low-order 3 digits of result to shifter <20:31>)
OWRY → OWRLSEL (sign code to shifter <32:35>)
Shift right 28 bits (to right justify the result, pulling in zeros to the left)
SHH → RRH (64-bit result)
SHL → RRL
(End of algorithm if 0 < operand < 1000)

Cycle 90 (operand is 0)

OWRX → OWRHSEL
0 → OWRLSEL
Shift left 30 bits to form a left-justified positive sign → RRH
"RIGHT 60" → SAR
Notify other units of computer that execution of this instruction is almost finished

Cycle 91

RRH → OWRHSEL
Shift right 60 bits (to form a zero result with positive sign code)
SHH → RRH
SHL → RRL
(End of algorithm if operand = 0)

APPENDIX III
ERROR ANALYSIS

During the process of converting binary numbers to decimal, small error factors are introduced which increase intermediate values slightly. When the final results are obtained from these intermediate values, the errors are truncated. The discussion which follows explains how the errors are introduced and then truncated so that the final result is correct.

Let $N = D0*(10^9) + D1*(10^8) + D2*(10^7) + D3*(10^6) + D4*(10^5) + D5*(10^4) + D6*1000 + D7*100 + D8*10 + D9$,
Where $Dj$ ($0 \leq j \leq 9$) are integers,
and $0 \leq D0 \leq 2$, and $0 \leq Dj \leq 9$ for $1 \leq j \leq 9$,
and $0 \leq N \leq 2,147,483,648$
Let $N1 = D0*(10^6) + D1*(10^5) + D2*(10^4) + D3*1000 + D4*100 + D5*10 + D6$
Let $N2 = D7*100 + D8*10 + D9$
From the above definitions, $N = 1000*N1 + N2$
Let E1, E2, and E3 be errors which will be discussed below.
The first step is to multiply N by $(10^{-3} + E1)$ and then add E3, where E1 and E3 are error factors. Using '0.004189374C'X to represent $10^{-3}$, it turns out that E1 is less than $2.04 * 10^{-13}$. Since E3 amounts to a carry-in to bit 28 of the fraction, E3 is less than $3.8 * 10^{-9}$.

$N*(10^{-3} + E1) + E3 = N1 + (10^{-3})*N2 + E1*N + E3$
$E1 < 2.04 * 10^{-13}$
$N \leq 2.147483648 * 10^9$
$E3 < 3.8 * 10^{-9}$
$E1*N + E3 < 4.4 * 10^{-4}$ Since the error is strictly less than $10^{-3}$, the computation for N1 is precise, and $(10^{-3})*N2 + E1*N + E3 < 1$.
The second step is to compute the three low-order decimal digits from the quantity $(10^{-3})*N2 + E1*N + E3$. This process is to multiply this value by 10 three times to extract the values of D7, D8, and D9.
Note that $(10^{-3})*N2 = (10^{-3})*(100*D7 + 10*D8 + D9) = D7*(10^{-1}) + D8*(10^{-2}) + D9(10^{-3})$
and
$E1*N + E3 < 4.4 * 10^{-4}$
Therefore, $D7 \leq 10*(10^{-3})*N2$
and $10*(10^{-3}*N2 + E1*N + E3) < D7 + D8*(10^{-1}) + D9*(10^{-2}) + 4.4*(10^{-3})$
From this, it follows, that the integer part of $10*((10^{-3})*N2 + E1*N + E3)$ is precisely D7, and the

APPENDIX III-continued
ERROR ANALYSIS

During the process of converting binary numbers to decimal, small error factors are introduced which increase intermediate values slightly. When the final results are obtained from these intermediate values, the errors are truncated. The discussion which follows explains how the errors are introduced and then truncated so that the final result is correct.

fraction part is at least
$D8*(10^{-1}) + D9(10^{-2})$, but less than
$D8*(10^{-1}) + D9*(10^{-2}) + 4.4*(10^{-3})$
Multiplying the new fraction by 10 produces a product that is at least $D8 + D9*(10^{-1})$, but less than
$D8 + D9*(10^{-1}) + 4.4*(10^{-2})$
The integer part of this new product is precisely D8, and the fractional part is at least
$D9*(10^{-1})$, but less than
$D9*(10^{-1}) + 4.4*(10^{-2})$
Multiplying the latest fraction by 10 produces a product that is at least D9, but less than
$D9 + 0.44$
The integer part of this product is precisely D9.
If $N < 1000$, then we are finished, and we have generated the correct values for D7, D8, and D9. (In this case, $D0 = D1 = D2 = D3 = D4 = D5 = D6 = 0$.) If $N \geq 1000$, then we have the correct values for D7, D8, and D9, but we still need to compute the other digits from N1.
The next step is to multiply N1 by $(10^{-6} + E2)$ and then add E3, where E2 and E3 are error factors. Using "0.000010C6F8'X to represent $10^{-6}$, it turns out that E2 is less than $3.4 * 10^{-13}$. Since E3 amounts to a carry-in to bit 28 of the fraction, E3 is less than $3.8 * 10^{-9}$.

$N1*(10^{-6} + E2) + E3 = (10^{-6})*N1 + E2*N1 + E3$
$E2 < 3.4 * 10^{-13}$
$N1 \leq 2.147483 * 10^6$
$E3 < 3.8 * 10^{-9}$
$E2*N1 + E3 < 7.4 * 10^{-7}$ Recall that $N1 = D0*(10^6) + D1*(10^5) + D2*(10^4) + D3*1000 + D4*100 + D5*10 + D6$
Then $D0 \leq (10^{-6})*N1 + E2*N1 + E3$
$< D0 + D1*(10^{-1}) + D2*(10^{-2}) + D3*(10^{-3}) + D4*(10^{-4}) + D5*(10^{-5}) + D6*(10^{-6}) + 7.4 * (10^{-7})$
Since the error is strictly less than $10^{-6}$, the computation for D0 is precise, and the rest of the computation is strictly less than 1.
The final step is to compute the six digits D1, D2, D3, D4, D5, and D6 from the fraction part of $(10^{-6})*N1 + E2*N1 + E3$. This process is to multiply this value by 10 six times to extract the values of D1, D2, D3, D4, D5 and D6.
Start with a fraction whose value is:
$D1*(10^{-1}) + D2*(10^{-2}) + D3*(10^{-3}) + D4*(10^{-4}) + D5*(10^{-5}) + D6*(10^{-6}) + 7.4*(10^{-7})$
Multiply this fraction by 10. The integer part will be precisely D1. The fraction part will be:
$D2*(10^{-1}) + D3*(10^{-2}) + D4*(10^{-3}) + D5*(10^{-4}) + D6*(10^{-5}) + 7.4*(10^{-6})$
Multiply this fraction by 10. The integer part will be precisely D2. The fraction part will be:
$D3*(10^{-1}) + D4*(10^{-2}) + D5*(10^{-3}) + D6*(10^{-4}) + 7.4*(10^{-5})$
Multiply this fraction by 10. The integer part will be precisely D3. The fraction part will be:
$D4*(10^{-1}) + D5*(10^{-2}) + D6*(10^{-3}) + 7.4*(10^{-4})$
Multiply this fraction by 10. The integer part will be precisely D4. The fraction part will be:
$D5*(10^{-1}) + D6*(10^{-2}) + 7.4*(10^{-3})$
Multiply this fraction by 10. The integer part will be precisely D5. The fraction part will be:
$D6*(10^{-1}) + 7.4*(10^{-2})$
Multiply this fraction by 10. The integer part will be precisely D6. The fraction part will be:
$7.4*(10^{-1})$ which is strictly less than 1.

We claim:

1. Apparatus operative in a first mode for converting a decimal number to a binary number and operative in a second mode for converting a binary number to a decimal number, each of the decimal numbers being represented as a sequence of BCD digits, the apparatus being for use in association with a data processing system having a plurality of functional units for performing arithmetic and logical operations, having a control means for generating a plurality of control signals to operate the functional units and having a clock signal, the control means updating the control signals once each clock cycle, the apparatus comprising:

a register having a first group of bits and having an input and an output;

a three-input adder having a first input coupled to a version of the first group of bits in the regiser output shifted left by one bit, a second input coupled to a version of the first group of bits in the register output shifted left by three bits and a thid input;

means operative in the first mode for iteratively providing to the third input as right-justified 4-bit binary numbers successive high- to low-order digits of the decimal number on successive cycles in a first series of the clock cycles;

means operative in the first mode for initializing the register prior to the first series of the clock cycles;

means operative in the first mode for loading the first group of bits in the register with the output of the adder on each of the first series of the clock cycles to iteratively convert the decimal number to binary;

means operative in the second mode for calculating a first product by multiplying the operand by a first multiplicand substantially equal to $10^{-m}$, where m is an integer between 1 and n−1, inclusive, the first product having an integer part and a fractional part, and for placing the fractional part in the first group of bits in the register prior to a series of m of the clock cycles; and means operative in the second mode for latching the input of the register to the output of the register on each of the series of m of the clock cycles to iteratively generate as the integer part of successive adder outputs the m low-order digits of the decimal number, one digit per clock cycle.

2. Apparatus for converting a binary operand to decimal, the decimal number being represented as a sequence of at most n BCD digits, for use in association with a data processing system having a plurality of functional units for performing arithmetic and logical operations, having a control means for generating a plurality of control signals to operate the functional units and having a clock signal, the control means updating the control signals once each clock cycle, the apparatus comprising:

a register having a first group of bits and having an input and an output;

means for calculating a first product by multiplying the operand by a first multiplicand substantially equal to $10^{-m}$, where m is an integer between 1 and n−1, inclusive, the first product having an integer part and a fractional part, the fractional part being placed in the first group of bits in the regiser prior to a series of m of the clock cycles;

a combinational adder having a first input coupled to a version of the register output shifted left by one bit, a second input coupled to a version of the first group of bits in the register output shifted left by three bits and an output coupled to the input of the register; and means for latching the input of the register to the output of the register on each of the series of m of the clock cycles to iteratively generate as the integer part of successive adder outputs the m low-order digits of the decimal number, one digit per clock cycle.

3. Apparatus according to claim 2, where $m < n-1$, further comprising:

means for calculating a second product by multiplying the integer part of the first product by a second multiplicand substantially equal to $10^{m-n+1}$, the second product having an integer part and a fractional part, the fractional part being placed in the register before a series of m−n+1 of the clock cycles distinct from the series of m of the clock cycles, wherein the means for latching latches the input of the register to the output of the register additionally on each of the series of m−n+1 clock cycles to iteratively generate as the integer part of successive adder outputs the m−n+1 digits of the decimal number immediately more significantly than the low-order m digits of the decimal number, one digit per clock cycle.

4. Apparatus operative in a first mode to convert radix-b numbers to binary and in a second mode to convert binary numbers to radix-b, each radix-b number being represented as a sequence of at most n digits occupying c bits each, comprising:

a convert register having an input and an output;

combinational computational means having a digit input, for combinationally generating a result equal to the value at the digit input plus b times the value in the convert register, the computational means result being coupled in its entirety to the input of the convert register;

means for operating the apparatus in the first mode; and means for operating the apparatus in the second mode.

5. Apparatus according to claim 4, wherein the means for operating the apparatus in the first mode comprises:

means for initializing the convert register;

means for iteratively providing to the digit input successive high- to low-order digits of the radix-b number; and means for updating the convert register with the output of the computational means after each iteration to iteratively calculate the binary number.

6. Apparatus according to claim 4, wherein the computational means result includes an integer part and a fractional part, and wherein the means for operating the apparatus in the second mode comprises:

means for calculating a first product by multiplying the binary number by a first multiplicand substantially equal to $b^{-m}$, where m is an integer greater than zero, the first product having an integer part and a fractional part, and for initializing the convert register with the fractional part of the first product; and first means, operative following initialization of the convert register, for iteratively updating the convert register with the fractional part of the computational means output, and for holding the digit input at zero during such iterative updating by the first means, to thereby iteratively generate as the integer part of the computational means result a first group of successive digits of the radix-b number.

7. Apparatus according to claim 6, wherein the means for operating the apparatus in the second mode further comprises:

means for calculating a second product by multiplying the integer part of the first product by a second multiplicand substantially equal to $b^{m-n+1}$, the second product having an integer part and a fractional part, and for reinitializing the convert register with the fractional part of the second product; and second means, operative following reinitialization of the convert register, for iteratively updating the convert register with the fractional part of the computational means result, and for holding the digit input at zero during such iterative updating by the second means, to thereby iteratively generate as the integer part of the computational means result a second group of successive digits of the radix-b number, the apparatus further comprising means for assembling the radix-b number as the integer part of the second product, followed by the second grouuup of digits, followed by the first group of digits, followed by a sign code.

8. Apparatus according to claim 6,
wherein $b=10$;
wherein the means for operating the apparatus to convert a radix-b number to binary comprises:
means for initializing the convert register;
means for iteratively providing to the digit input successive high- to low-order digits of the radix-b number; and
means for updating the convert register with the output of the computational means after each iteration to iteratively calculate the binary number; and
wherein the computational means comprises combinational means for adding together concurrently (a) a one-bit left shift of the value in the convert register; (b) a three-bit left shift of the value in the convert register and (c) the value at the digit input.

9. Apparatus according to claim 8, wherein the means for iteratively providing comprises:

operand register means having a high-order position coupled right justified to the digit input of the computational means;

means for loading at least the significant digits of the radix-b number into the operand register means; and means for shifting the value in the operand register means toward the high-order position after each iteration.

10. Apparatus according to claim 8,
wherein $n=10$,
wherein $m=3$ and wherein the means for operating the apparatus to convert a binary number to radix-b iteratively generates the low-order three digits of the radix-b number,
wherein the means for operating the apparatus to convert a binary number to radix-b further comprises means for calculating a second product by multiplying the integer part of the first product by a second multiplicand substantially equal to $10^{-6}$, the second product having an integer part and a fractional part, the convert register being reinitialized with the fractional part of the second product following generation of the low-order three digits of the radix-b number, to thereby generate the six digits of the radix-b number immediately more significant than the low-order three digits of the radix-b number; and means for collecting in sequence the integer part of the second product, the six digits of the radix-b number immediately more significant than the low-order three digits of the radix-b number, the low-order three digits of the radix-b number and a sign code to assemble the radix-b number.

11. Apparatus for performing bidirectional conversion of numbers between binary and decimal in response to first and second programmed signals, the decimal number being represented as a sequence of at most 10 BCD digits, for use in association with a high speed data processing system having a plurality of functional units for performing arithmetic and logical operations, having a control means for generating a plurality of control signals to operate the functional units and having a clock signal, the control means updating the plurality of control signals once each clock cycle, the apparatus comprising:

a convert register having an input and an output and latching the input to the output on each clock cycle, the convert register having a first group of bits in which the binary number is calculated or from which the decimal number is calculated;

a combinational adder having an output and having a first input coupled to a version of the entire first group of bits in the convert register shifted left by one bit, a second input coupled to a version of the entire first group of bits in the convert register shifted left by three bits and a third input, the output of the adder being coupled unshifted to the input of the convert register with the low-order bit of the first group of bits receiving the low-order bit of the output of the adder;

an operand register having an output having a high-order nibble, the high-order nibble of the operand register output being coupled right-justified to the third input of the adder;

means for operating the apparatus to convert a decimal number to binary in response to the first programmed signal, comprising:

means for preloading the first group of bits in the convert register with zero prior to a first series of the clock cycles;

means for loading the decimal number into the operand register with the most significant digit of the decimal number in the high-order nibble of the operand register, the loading of the operand register taking place prior to the first series of cycles, the combinational adder thereby providing to the input of the convert register a first intermediate result in response to the values in the convert register and the operand register; and means for clocking the output of the combinational adder into the convert register after each of the cycles in the first series of cycles and for shifting the value in the operand register by one nibble toward the high-order nibble after each of the cycles in the first series of cycles to thereby iteratively calculate the binary number in the convert register, one decimal digit being converted on each clock cycle in the first series of cycles;

the apparatus further comprising:

means for operating the apparatus to convert a binary number to a decimal number in response to the second programmed signals, comprising:

means for calculating a first product by multiplying the binary number by a first multiplicand substantially equal to $10^{-m}$, $0<m<9$, the first product having an integer part and a fractional part, and for subsequently initializing the convert register with the fractional part of the first product left-justified in the first group of bits prior to a second series of the clock pulses;

means for calculating a second product by multiplying the integer part of the first product by a second multiplicand substantially equal to $10^{m-9}$, the second product having an integer part and a fractional part, and for initializing the convert register with the fractional part of the second product left-justified in the first group of bits prior to a third series of the clock pulses distinct from the second series of the clock pulses;

means for supplying zero to the third input of the adder for each cycle in the second and third series of cycles; and means for collecting in sequence the integer part of the second product, the integer part of the output of the adder following each cycle in the third series of cycles, the integer part of the output of the adder following each cycle in the second series of cycles and a sign code to thereby assemble the decimal number.

12. Apparatus according to claim 11, wherein the first multiplicand is substantially equal to the hexadecimal number 0.004189374C and the second multiplicand is substantially equal to the hexadecimal number 0.000010C6F8;

wherein the means for calculating the first product further comprises means, operative prior to initialization of the convert register with the fractional part of the first product, for truncating the fractional part of the first product to leave a predetermined number of bits to the right of the binary point and for adding 1 in the low order bit position of the truncated fractional part of the first product, and wherein the means for calculating the second product further comprises means, operative prior to initialization of the convert register with the fractional part of the second product, for truncating the fractional part of the second product to leave the predetermined number of bits to the right of the binary point and for adding 1 in the low order bit position of the truncated fractional part of the second product, the predetermined number being at least 22.

13. Apparatus according to claim 11, wherein the means for supplying zero to the third input of the adder comprises means for loading zero into the operand register prior to each of the second and third series of cycles and for maintaining zero in the operand register for each cycle in the second and third series of cycles.

* * * * *